(12) United States Patent
Smith

(10) Patent No.: US 10,304,683 B2
(45) Date of Patent: May 28, 2019

(54) EARLY GATE SILICIDATION IN TRANSISTOR ELEMENTS

(71) Applicant: GLOBALFOUNDRIES Inc., Grand Cayman (KY)

(72) Inventor: Elliot John Smith, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/845,340

(22) Filed: Dec. 18, 2017

(65) Prior Publication Data

US 2019/0131133 A1    May 2, 2019

Related U.S. Application Data

(60) Provisional application No. 62/579,394, filed on Oct. 31, 2017.

(51) Int. Cl.
| | | |
|---|---|---|
| *H01L 21/28* | (2006.01) | |
| *H01L 29/49* | (2006.01) | |
| *H01L 21/66* | (2006.01) | |
| *H01L 21/285* | (2006.01) | |
| *H01L 27/088* | (2006.01) | |
| *H01L 29/417* | (2006.01) | |
| *H01L 29/66* | (2006.01) | |

(52) U.S. Cl.
CPC .. *H01L 21/28052* (2013.01); *H01L 21/28518* (2013.01); *H01L 22/14* (2013.01); *H01L 27/0883* (2013.01); *H01L 29/41783* (2013.01); *H01L 29/4933* (2013.01); *H01L 29/66606* (2013.01)

(58) Field of Classification Search
CPC ......... H01L 21/28052; H01L 29/66606; H01L 29/41783; H01L 27/0883; H01L 22/14; H01L 29/4933; H01L 21/28518
See application file for complete search history.

(56) References Cited

U.S. PATENT DOCUMENTS

| | | | | |
|---|---|---|---|---|
| 8,841,192 | B2 * | 9/2014 | Lee | H01L 29/66507 438/299 |
| 2004/0063264 | A1 * | 4/2004 | Zheng | H01L 21/82381 438/199 |
| 2004/0188777 | A1 * | 9/2004 | Hwang | H01L 27/112 257/403 |
| 2013/0323893 | A1 * | 12/2013 | Chuang | H01L 27/1116 438/229 |

FOREIGN PATENT DOCUMENTS

JP        2007115830     *  5/2007

* cited by examiner

Primary Examiner — Matthew L Reames
Assistant Examiner — Benjamin T Liu
(74) Attorney, Agent, or Firm — Amerson Law Firm, PLLC

(57) ABSTRACT

By decoupling the formation of a metal silicide in the gate electrode structure and the raised drain and source regions, superior flexibility in designing transistor elements and managing overall process flow may be achieved. To this end, the metal silicide in the gate electrode structures may be formed prior to actually patterning the gate electrode structures, while, also during this process sequence, a mask material may be applied for reliably covering any device regions in which a silicidation is not required. Consequently, superior gate conductivity may be accomplished, without increasing the risk of silicide penetration into the channel region of sophisticated fully depleted SOI transistors.

20 Claims, 13 Drawing Sheets

EARLY GATE SILICIDATION IN TRANSISTOR ELEMENTS

BACKGROUND

1. Field of the Disclosure

Generally, the present disclosure relates to semiconductor devices and manufacturing techniques in which overall device performance may be improved by reducing resistivity of certain device areas, such as gate electrodes and drain and source regions, on the basis of a silicidation process.

2. Description of the Related Art

Significant progress has been made in the field of semiconductor devices, caused mainly by the continuous reduction of critical dimensions of respective circuit elements, such as transistor elements, resistors, capacitors and the like. Basically, important performance parameters and characteristics of sophisticated semiconductor devices, such as integration density, power consumption, switching speed and the like, may depend strongly on reduced overall device dimensions. Consequently, in advanced semiconductor devices, up to several hundred millions of transistor elements, in addition to other circuit elements, such as resistors, may be implemented in order to provide superior overall performance. In this manner, even complete systems may be incorporated in a single semiconductor chip, wherein not only sophisticated control logic may be implemented, but also additional circuit functions, such as radio frequency (RF) capabilities, analog signal processing and other functions, may be incorporated so as to provide enhanced overall functionality in combination with connectivity to the periphery.

In particular, due to significant advantages with respect to power consumption in digital circuitry, CMOS technique has proven to be a very viable concept in which field effect transistors of complementary type may provide a low static power consumption. A field effect transistor typically comprises a channel region, the conductivity of which may be controlled by a gate electrode positioned in the vicinity of the channel region so as to control current flow from a source region to a drain region. By continuously reducing the length of the channel region and, thus, the length of the respective gate electrode structure controlling the conductivity of the channel region, significant advances have been made with respect to switching speed and integration density, as discussed above. In currently available semiconductor devices, transistor elements having a gate length of approximately 30 nm and significantly less may be encountered, which, irrespective of the many advantages associated with the reduced gate length, may also require additional measures for countering specific adverse effects, such as reduced channel controllability, variations in transistor characteristics and the like. For example, over the past decades, the so-called "planar" transistor geometry has represented a major design concept for forming field effect transistors, wherein a substantially planar capacitive structure formed by the channel region, serving as one electrode portion, followed by the gate dielectric material acting as the capacitor dielectric, followed by a further planar electrode, i.e., the gate electrode, may have resulted in effective and cost-efficient manufacturing techniques. Upon further reducing the gate length of sophisticated planar transistor elements, thereby also typically involving a respective reduced area consumption of such sophisticated planar transistor elements, designers and engineers of sophisticated semiconductor devices have been confronted with increasingly emerging problems with respect to appropriately controlling the channel region, reducing fluctuations in the channel region associated with the respective dopant concentrations, and increased contact resistivity of certain device areas, such as the gate electrode, the drain and source regions and the like.

For example, although the gate electrode structure may be basically formed on the basis of well-established semiconductor materials, such as silicon and the like, it is typically necessary to reduce resistivity of the basic semiconductor material, which may be accomplished by forming a respective semiconductor compound, such as a nickel silicide, since a metal-containing silicide has a significantly reduced resistivity compared to the semiconductor material, even if provided in a highly doped state. Similarly, the drain and source regions, typically provided as highly doped semiconductor materials, may also receive a metal silicide in order to at least reduce contact resistivity of these highly doped semiconductor regions.

Furthermore, due to respective technological challenges, as discussed above, SOI (semiconductor- or silicon-on-insulator) architectures have been increasingly introduced, for instance, for generally reducing the parasitic capacitance of transistor elements and taking advantage of the substantially fully isolated nature of the transistor body region. Furthermore, when further reducing lateral dimensions of basically planar transistor architectures, highly efficient concepts have been developed in which the parasitic capacitance may be even further reduced by providing a fully depleted channel region. This may be accomplished by providing a very thin basic semiconductor material, such as a crystalline silicon material, crystalline silicon/germanium material and the like, while, additionally, an extremely low dopant concentration may be established or a substantially intrinsic semiconductor material may be provided within a major portion of the channel region. Although such fully depleted SOI architectures have proven to be a promising concept in view of further reducing overall lateral dimensions, such as the gate length, it turns out that, in particular, the process of reducing contact resistivity based on well-established silicidation concepts may be difficult due to the very reduced thickness of the basis semiconductor layer, which may be in the range of 15 nm and even significantly less. For this and many other reasons, raised drain and source regions are typically provided in respective transistor elements, wherein epitaxial growth techniques may be applied so as to form a highly doped crystalline semiconductor material laterally adjacent to the gate electrode structure that is connected to the thin basic semiconductor layer. In a corresponding process strategy, well-established silicidation concepts may still be applied in which the silicon material of the gate electrode structure and the silicon material in the raised drain and source regions may be transformed into a metal silicide in a common process sequence.

In addition to transistor elements, typically other types of circuit elements, for instance resistors, have to be provided with appropriate resistance values as required by the basic circuit design. Frequently, such resistors, or other areas in the semiconductor device, may be formed on the basis of semiconductor material, wherein significant portions thereof may have to be excluded from the silicidation process in order to comply with the overall device requirements. To this end, prior to performing the silicidation process, after completing the raised drain and source regions, an appropriate mask layer may be formed so as to reliably cover respective device areas in which a silicidation of an underlying semiconductor material has to be avoided. In this manner, silicide-free regions may be obtained, while the gate electrode structure and the raised drain and source regions may receive a corresponding highly conductive metal silicide, wherein, among other things, prior to performing the silicidation process, in addition to masking respective device regions, the surface of the gate electrode structure, in particular, has to be exposed, which may also contribute to a more or less complex process sequence prior to the silicidation process. Irrespective of this well-established technology for providing reduced resistivity in the gate electrode structures and the raised drain and source regions, it appears to be very challenging to further reduce overall resistance, for instance, by increasing a depth of the respective metal silicide regions, since, in particular in the raised drain and source regions, irrespective of their raised architecture, the risk of fully siliciding the drain and source regions with uncontrolled expansion into the channel region may be increased, thereby rendering any such concepts less than desirable. On the other hand, increasing the height of the raised drain and source regions may not represent a viable solution, since RF performance may be adversely affected due to increased fringe capacitance between gate electrodes and raised drain and source regions.

In view of the situation described above, the present disclosure, therefore, relates to techniques and respective semiconductor devices in which field effect transistors may be formed on the basis of a planar configuration, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that the process of forming a highly conductive metal semiconductor compound in one type of device region may be decoupled from the process of forming a metal semiconductor compound in a different type of device region. For example, the formation of a highly conductive metal semiconductor compound in gate electrode structures may be decoupled from the formation of a metal semiconductor compound in drain and source regions, which may be accomplished by forming the metal semiconductor compound for the gate electrode structure in an early manufacturing stage. In some illustrative embodiments, in this early manufacturing stage, a respective mask layer may be provided so as to reliably cover any device regions which may be excluded from the early process of forming a metal semiconductor compound, while otherwise having substantially the same stack configuration as a gate electrode structure.

One illustrative embodiment disclosed herein relates to a method including forming a semiconductor-containing material layer above a semiconductor layer of a semiconductor device. The method further includes converting a portion of the semiconductor-containing material layer into a first metal semiconductor compound. Moreover, a gate electrode structure is formed on the basis of the portion. Additionally, the method includes forming drain and source regions adjacent to the gate electrode structure. Furthermore, the method includes forming a second metal semiconductor compound in the drain and source regions.

A further illustrative embodiment disclosed herein relates to a method including forming a mask layer above a layer stack of a semiconductor device, wherein the mask layer exposes a first portion of the layer stack and covers a second portion of the layer stack, and wherein the layer stack comprises a silicon-containing layer for a gate electrode structure. The method further includes converting the first portion into a metal semiconductor compound and preserving the second portion by using the mask layer. Additionally, the method includes forming a hard mask layer above the layer stack and patterning the hard mask layer so as to define lateral sizes and shapes of the gate electrode structure above the first portion and of a non-gate electrode structure above the second portion. Furthermore, the method includes forming the gate electrode structure and the non-gate electrode structure by patterning the layer stack using the patterned hard mask layer.

A still further illustrative embodiment disclosed herein relates to a semiconductor device including a transistor element including a gate electrode structure and raised drain and source regions. The gate electrode structure comprises a first metal silicide and the raised drain and source regions comprise a second metal silicide, wherein the first and second metal silicides differ in at least one of a thickness and a material composition.

BRIEF DESCRIPTION OF THE DRAWINGS

The disclosure may be understood by reference to the following description taken in conjunction with the accompanying drawings, in which like reference numerals identify like elements, and in which:

FIGS. 6A, 6B, 7A, 7B, 8A, 8B, 9A, 9B, 10A, 10B, 11A, 11B, 12A, 12B, 13A, 13B, 14A and 14B schematically illustrate cross-sectional views of the semiconductor device in further advanced manufacturing stages, wherein FIGS. 6A-14A illustrate embodiments with the hard mask layer based on silicon nitride, while FIGS. 6B-14B illustrate the respective semiconductor device based on a hard mask layer using silicon dioxide;

Figure 1:
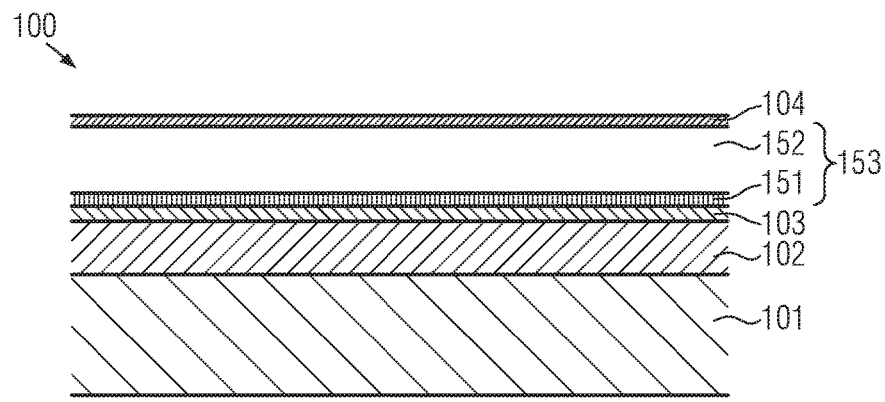
FIGS. 1-5 schematically illustrate cross-sectional views of a semiconductor device during various manufacturing stages in forming a metal semiconductor compound in respective device regions on the basis of a gate electrode layer stack, while preserving certain portions of the electrode layer stack, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is based on the inventor's finding that the common process sequence for forming the highly conductive metal semiconductor compounds in the gate electrode structure and the raised drain and source regions, although providing superior conductivity, may still lead to less performance gain than expected, since, in particular, upon further scaling overall transistor dimensions, for example, the respective conversion of semiconductor material into a metal semiconductor compound has to be controlled on the basis of limitations set by the raised drain and source regions in order to reliably avoid penetration of the metal semiconductor compound into the fully depleted channel region. On the other hand, further increasing the height of the raised drain and source regions, in addition to requiring increased cycle times during the selective epitaxial growth process, may possibly increase the fringe capacitance between the raised drain and source regions and the gate electrode structure, thereby reducing overall RF performance. By decoupling the process of forming the metal semiconductor compound for the gate electrode structures from the process of forming the metal semiconductor compound in the drain and source regions, superior flexibility in designing the transistor element may be achieved, since, for instance, the type and/or the depth of extension of the metal semiconductor compound in the gate electrode structure may be selected separately with respect to the type and/or depth of extension of the metal semiconductor compound in the drain and source regions.

As will be discussed later on in more detail, even a gate electrode structure may be provided in which substantially all of the semiconductor material contained therein may be converted into a metal semiconductor compound, in particular, for complex gate electrode structures in which metal-containing barrier materials in combination with high-k dielectric materials may be implemented, since, in these structures, respective mechanisms for adjusting channel controllability, such as threshold voltage and the like, may have to be implemented without being based on a semiconductor material, such as a polysilicon material and the like. Furthermore, by applying a respective conversion process in an early manufacturing stage to the gate electrode structure, different masking regimes for providing a hard mask layer for actually patterning the gate electrode structure may be applied, thereby potentially reducing overall process complexity, for instance, with respect to exposing the surface of the gate electrode structure in a very advanced manufacturing stage and the like. Furthermore, the exclusion of certain device areas, such as resistor elements and the like, which may be formed on the basis of the layer stack of the gate electrode structure, may also be accomplished in an early manufacturing stage, thereby also contributing to superior process efficiency during the further processing.

FIG. 1 schematically illustrates a cross-sectional view of a semiconductor device 100 in an early manufacturing stage in which a semiconductor layer 103, such as a crystalline silicon layer, a crystalline silicon/germanium layer and the like, may be provided on a buried insulating layer 102, which may comprise standard dielectric materials, such as silicon dioxide, silicon nitride and the like, while, in other cases, in addition or alternatively, the buried insulation layer 102 may include high-k dielectric materials, possibly forming a ferroelectric phase and the like, depending on the overall device requirements. The buried insulating layer 102 may be formed on any appropriate carrier material or substrate material 101, such as crystalline silicon material and the like. It is to be noted that the principles disclosed herein may be highly advantageous for fully depleted SOI transistors, however, in other illustrative embodiments (not shown), the concepts of the present disclosure may also be applied to other transistor architectures, such as a bulk architecture, in which a buried insulating layer may not be provided.

As previously discussed, in some illustrative embodiments, the semiconductor layer 103 may have an appropriate configuration so as to provide fully depleted channel regions, which may be accomplished by providing the layer 103 with an initial thickness of 15 nm and even less, wherein an initial dopant concentration, at least in areas corresponding to channel regions still to be formed, may also be moderately low or may even be provided in the form of an intrinsic semiconductor material.

In this manufacturing stage, the semiconductor device 100 may further comprise a material layer stack 153, for instance, comprising a first layer or sequence of layers 151, which may include a dielectric material, for instance, including a high-k dielectric material, possibly in combination with a metal-containing barrier material, a threshold voltage-adjusting material and the like. Moreover, the layer stack 153 may comprise a semiconductor-containing material layer 152, such as a silicon-containing layer, a germanium-containing layer in combination with silicon and the like, in order to comply with the requirements of a gate electrode structure still to be formed on the basis of the layer stack 153. For example, frequently, amorphous silicon may be provided in an appropriately doped state when a certain specific resistivity is required for the material of a gate electrode structure. Furthermore, in some illustrative embodiments, as will be described later on in more detail, non-gate electrode structures may have to be formed on the basis of the material layer stack 153, for instance, for providing resistors and the like, wherein the basic conductivity of the material layer 152 may have a significant influence on the performance of these non-gate electrode devices.

In some illustrative embodiments, the conductivity of the layer 152 in a later manufacturing stage may, thus, be substantially completely determined by a corresponding metal semiconductor compound still to be formed, thereby enabling adaptation of the material characteristics of the layer 152, for instance, with respect to dopant concentration and the like, in view of other non-gate electrode devices, such as resistors. For example, if high ohmic resistor elements may have to be provided, the dopant concentration of the semiconductor-containing material 152 may be selected so as to correspond to the desired specific resistivity, while the desired high conductivity of any gate electrode structures may be achieved on the basis of the metal semiconductor compound to be formed from the layer 152. Similar considerations may also apply to the basic thickness of the layer 152, since, as will be discussed later on, in some illustrative embodiments, substantially all of the material of the layer 152 may be converted into a metal semiconductor compound, thereby obtaining high conductivity even if a reduced overall height of a corresponding gate electrode structure may be achieved. On the other hand, if a certain height of the basic material layer 152 is required for non-gate electrode devices, the thickness of the layer 152 may be selected in accordance with respective requirements for these devices without substantially affecting the performance of the corresponding gate electrode structures.

Moreover, in some illustrative embodiments, a mask layer 104 may be formed above the layer stack 153, for instance, comprising silicon nitride or any other appropriate materials for forming a mask, which may cover respective regions of the semiconductor device 100 in which a process for converting the layer 152 into a metal semiconductor compound is to be avoided.

The semiconductor device 100 as illustrated in FIG. 1 may be formed on the basis of the following processes. The semiconductor layer 103, which may be basically provided as an SOI substrate, may be processed, if required, so as to comply with respective requirements in terms of thickness, material composition and the like, which may be accomplished on the basis of well-established process techniques. Thereafter, the layer stack 153 may be deposited, possibly in combination with respective pre- and post-deposition treatments, so as to form the required sequence of materials based on well-established process techniques. These processes may also include the deposition of high-k dielectric materials and metal-containing barrier materials, if required. Thereafter, the mask layer 104 may be formed, for instance, by well-established deposition techniques for providing silicon nitride material and the like. It should be appreciated that, contrary to conventional strategies in which a metal semiconductor compound may be formed in a moderately late manufacturing stage, the layer 104 may be patterned based on respective lithography techniques for masking any regions that may not receive a metal semiconductor compound, while the processes for patterning the layer stack 153 may be applied in a later manufacturing stage after transforming at least a portion of the layer stack 153.

Figure 2:
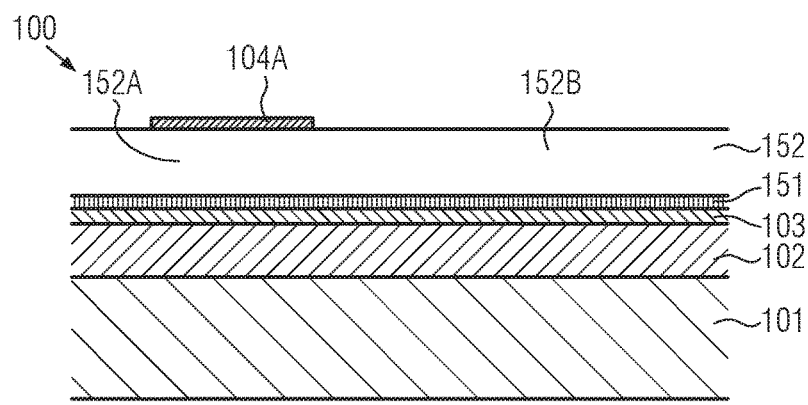

FIG. 2 schematically illustrates a cross-sectional view of the semiconductor device 100 after patterning the mask layer 104 (FIG. 1) so as to provide a mask 104A that covers a portion 152A of the semiconductor-containing material layer 152, which may be used for forming a non-gate electrode structure, while a portion 152B of the layer 152 may be exposed so as to enable efficient transformation of the semiconductor-based material of the layer 152 into a metal semiconductor compound. To this end, well-established lithography techniques may be applied, wherein a lithography mask (not shown) may be used, as may also be conventionally applied in a late manufacturing stage when requiring the masking of device structures that have to be excluded from a respective transformation of semiconductor material into a metal semiconductor compound. It should be noted that, due to the substantially planar topography, the deposition and patterning of the mask layer 104 may be accomplished in a highly efficient manner.

Figure 3:
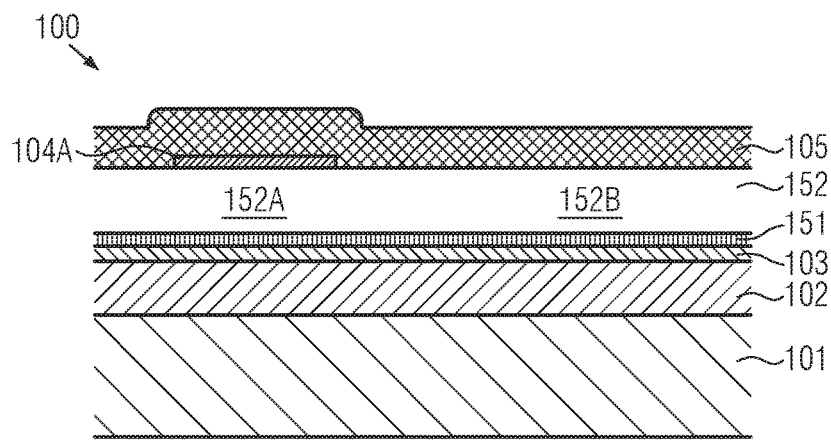

FIG. 3 schematically illustrates a cross-sectional view of the semiconductor device 100 with a metal layer 105 formed above the semiconductor-containing layer 152. As shown, the metal layer 105 may be provided with appropriate material composition and thickness above the portions 152B and 152A of the layer 152, wherein direct contact of the material of the layer 105 with material of the portion 152A is avoided due to the presence of the mask 104A. The metal layer 105 may comprise any appropriate metal, such as nickel, platinum, cobalt, titanium and the like, depending on the overall requirements. It should be appreciated that respective deposition techniques are well established and may be applied for forming the layer 105. It should be further noted that the layer 105 may comprise two or more layers of different materials, if considered appropriate.

Figure 4:
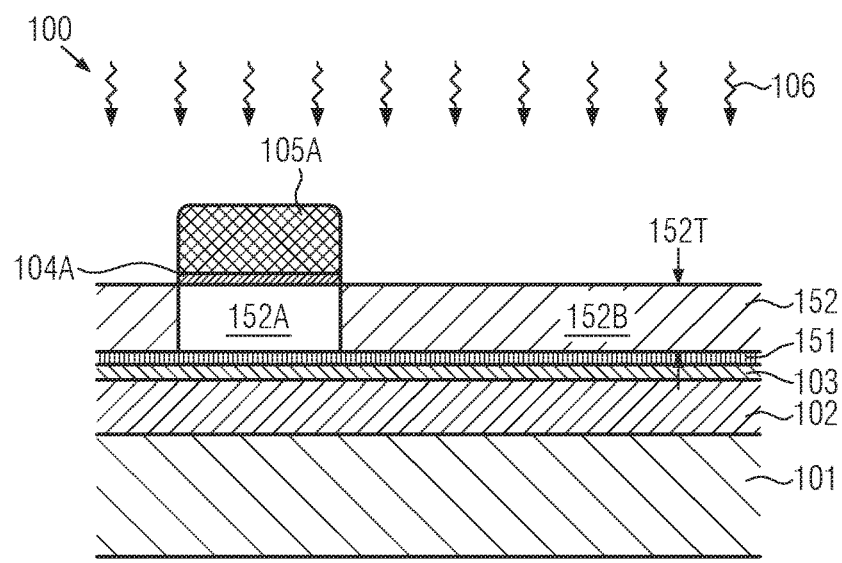

FIG. 4 schematically illustrates the semiconductor device 100 in a further advanced manufacturing stage. As shown, a treatment 106, for instance, comprising the application of a specific ambient and temperature, may be applied so as to initiate the chemical reaction between the species of the layer 105 (FIG. 3) and the underlying semiconductor material of the layer 152. Depending on the initial layer thickness of the layer 152 and the process conditions of the treatment 106, and also based on the initial thickness of the layer 105, a respective conversion from semiconductor material into a metal semiconductor compound may be achieved, thereby forming a metal semiconductor compound, such as a metal silicide, in the portion 152B of the layer 152. As discussed above, the composition of the metal semiconductor compound, which, for simplicity, may also be denoted by the reference numeral 152B, may be adjusted in view of the requirements for any gate electrode structures still to be formed, while, on the other hand, a depth or thickness 152T of the metal semiconductor compound 152B may also be adjusted in accordance with requirements for a gate electrode structure.

In one illustrative embodiment, as, for instance, shown in FIG. 4, the layer 152 may be transformed into a metal semiconductor compound substantially throughout its complete initial thickness, thereby providing a maximum conductivity for otherwise identical device parameters. On the other hand, a non-reacted portion 105A of the layer 105 (FIG. 3) may be preserved above the mask 104A, thereby also preventing a significant portion of the portion 152A from being converted into a metal semiconductor compound. It should be appreciated that any lateral advance of the transformation process below the mask 104A during the treatment 106 may not be shown in FIG. 4, and any such lateral reduction of the size of the non-converted portion 152A may be taken into account by adopting the lateral size and shape of the mask 104A. As a consequence, the non-reacted portion 152A may be provided with desired lateral dimensions, while other material characteristics, such as dopant concentration, thickness and the like, may also be selected in view of the device characteristics to be achieved for non-gate electrode structures. It should be further noted that, during the treatment 106, the layer 151, for instance, a high-k dielectric material formed therein and/or a metal-containing barrier material, may reliably stop the conversion process so as to substantially preserve integrity of the layer or layer system 151.

Figure 5:
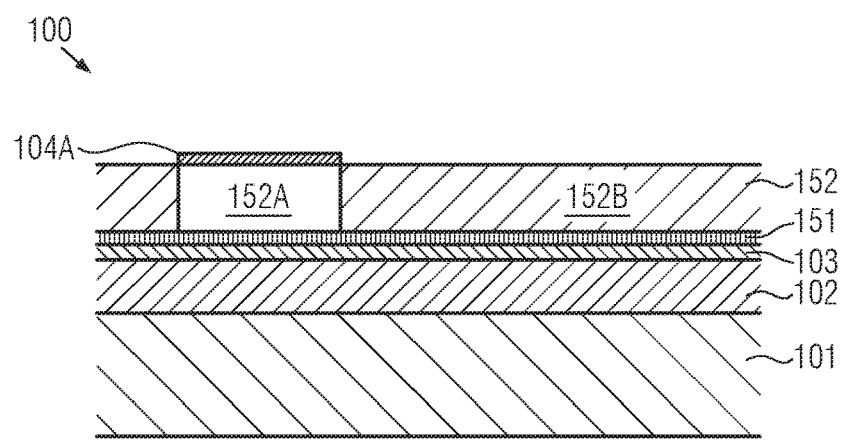

FIG. 5 schematically illustrates the semiconductor device 100 after removing any non-reacted metal material, thereby exposing the mask 104A formed above the substantially not-transformed portion 152A. Furthermore, if required, a further treatment (not shown) may be applied in order to adjust overall characteristics of the metal semiconductor compound 152B in terms of stoichiometric composition, stability and the like. Any such treatments may be performed on the basis of well-established process techniques.

Figure 6A:
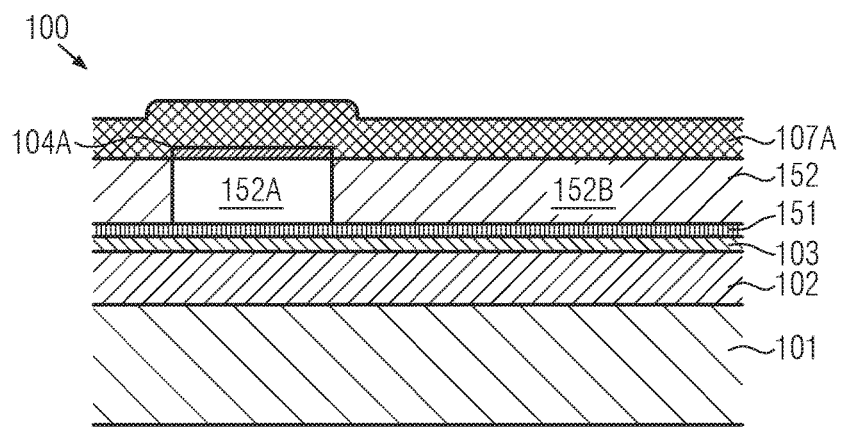

FIG. 6A schematically illustrates the semiconductor device 100 after the deposition of a hard mask layer 107A, which, in the embodiment shown in FIG. 6A, comprises silicon nitride and may, thus, have a substantially similar composition as the mask 104A that covers the non-converted portion 152A. The hard mask layer 107A may be formed on the basis of well-established deposition techniques and with a thickness that is appropriate for forming hard mask features that may be subsequently used for patterning gate electrode structures and non-gate electrode structures.

Figure 6B:
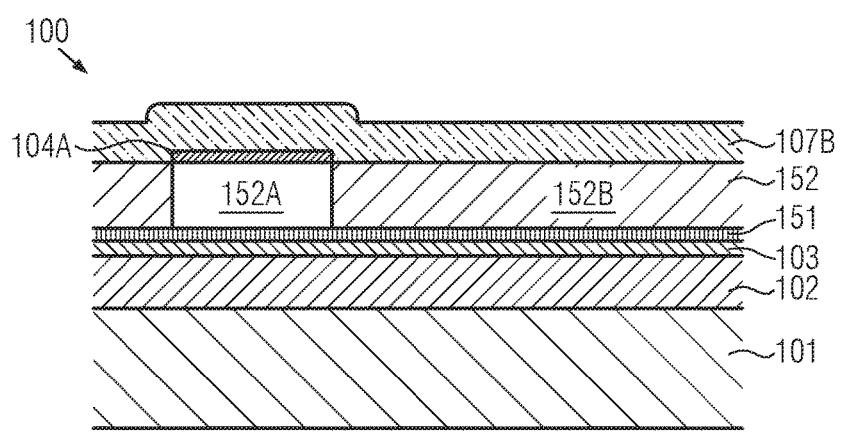

FIG. 6B schematically illustrates the semiconductor device 100 according to further illustrative embodiments in which a hard mask layer of different material composition, such as a layer 107B comprising silicon dioxide, may be formed above the portions 152B, 152A, wherein, in the embodiment shown, the mask 104A and the hard mask layer 107B may have different material compositions and may, thus, exhibit different etch characteristics during the subsequent patterning of the hard mask layer 107B. In this case, a plurality of deposition techniques for a silicon dioxide material are also well established in the art and may be applied for forming the hard mask layer 107B. It should be appreciated that a thickness of the hard mask layer 107B may be selected so as to provide sufficient etch resistivity during a subsequent patterning of the layer portions 152B, 152A, which may be accomplished on the basis of experiments and the like.

Figure 7A:
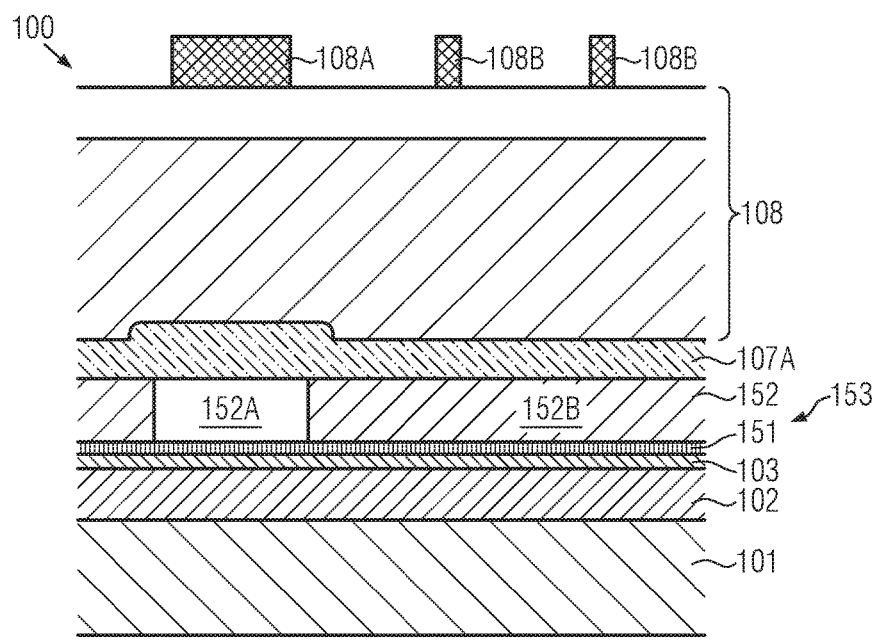
Figure 7B:
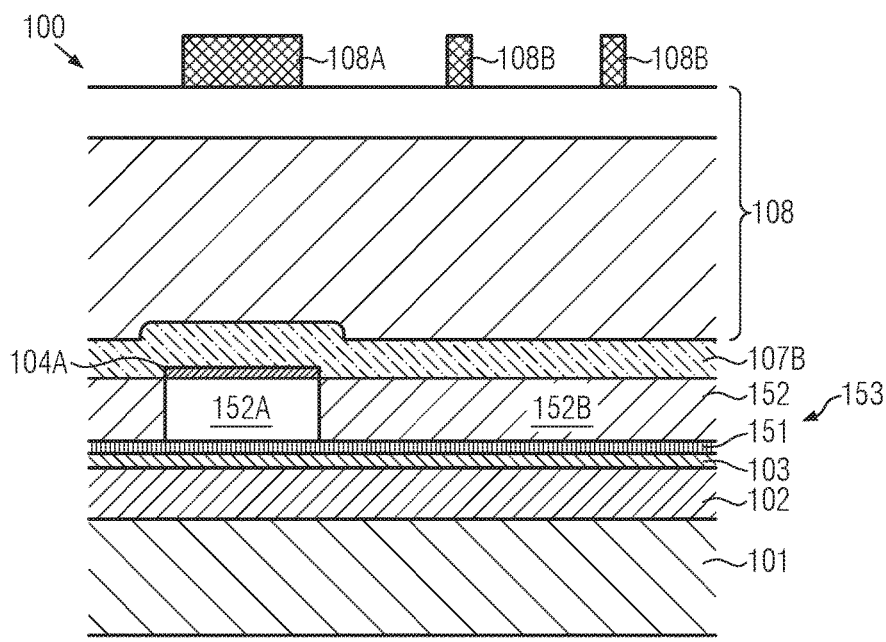

FIGS. 7A and 7B schematically illustrate cross-sectional views of the semiconductor device 100 in a further advanced manufacturing stage, wherein, for convenience, FIG. 7A schematically illustrates the semiconductor device 100 with the hard mask layer 107A, while FIG. 7B illustrates the device 100 with the hard mask layer 107B, as discussed above. Furthermore, in both figures, a layer stack 108 may be provided for lithographically patterning the layer stack 153. For example, planarization materials, a bottom anti-reflective coating and the like may be provided within the layer stack 108, followed by a final resist layer, which may be patterned into a respective feature 108A and features 108B, wherein the former corresponds to the lateral size and shape of a structure to be patterned on the basis of the portion 152A, while the features 108B may be used for patterning respective gate electrode structures. It should be appreciated that the layer stack 108 may be deposited on the basis of well-established techniques, followed by sophisticated lithography processes and respective development and patterning sequences for forming the resist features 108A, 108B.

Thereafter, the further patterning process may be continued so as to etch into the lower-lying materials of the layer stack 108 and finally patterning the respective hard mask layers 107A, 107B, respectively. For example, when referring to the embodiment as illustrated in FIG. 7A, the patterning of the hard mask layer 107A may be accomplished by applying etch techniques for etching through silicon nitride material using the non-reacted portion 152A as a stop material, while the metal semiconductor compound in the portion 152B may also provide appropriate process control for ending the respective patterning process.

On the other hand, the hard mask layer 107B may be etched on the basis of well-established etch recipes by using the portion 152B and the mask 104A as stop materials. Thereafter, the etch chemistry may be changed so as to etch through the mask layer 104A at relevant regions thereof in order to expose the respective portions of the underlying non-reacted portion 152A. In this manner, a highly controllable patterning process above the portion 152A may be accomplished due to the additional etch stop characteristics of the mask 104A.

Figure 8A:
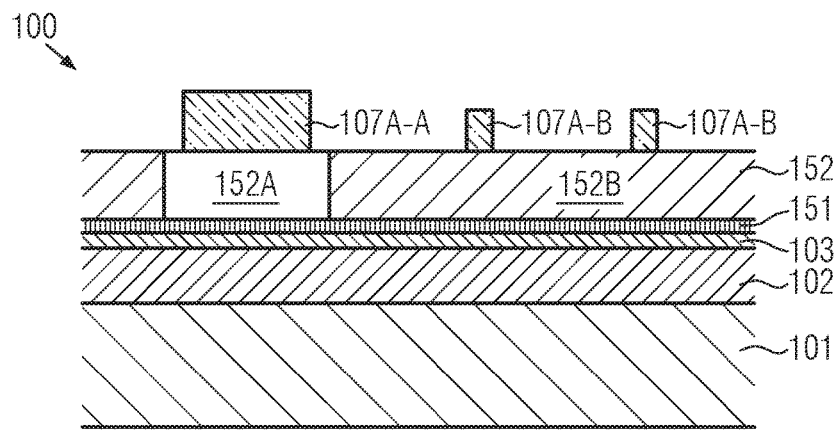
Figure 8B:
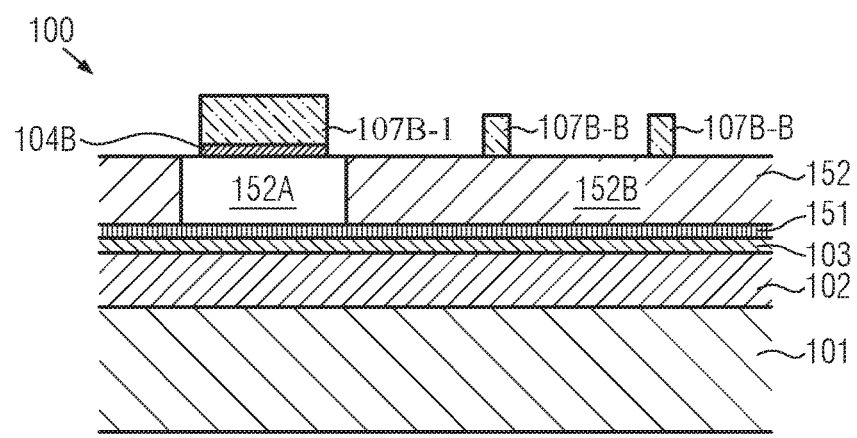

FIGS. 8A and 8B schematically illustrate cross-sectional views of the semiconductor device 100 after patterning the respective hard mask layers 107A, 107B (see FIGS. 7A, 7B). As illustrated in FIG. 8A, respective mask feature 107A-A for defining the lateral size and shape of a structure to be formed on the basis of the non-reacted portion 152A and mask features 107A-B may be provided so as to define the lateral size, shape and position of gate electrode structures to be formed on the basis of the converted portion 152B. As discussed above, the hard mask features 107A-AB may be provided in the form of silicon nitride features, thereby achieving a high degree of compatibility with conventional patterning strategies, since, typically, a respective hard mask layer for patterning sophisticated gate electrode structures may be provided in the form of a silicon nitride material.

Similarly, the semiconductor device 100 as illustrated in FIG. 8B has formed thereon respective hard mask features 107B-A for patterning the non-reacted portion 152A and 107B-B for patterning the converted portion 152B. In this case, the respective hard mask features 107B-AB may be provided in the form of silicon dioxide-based components due to the different initial material composition of the hard mask layer 107B (FIG. 7B). It should be noted that, in both cases, the mask 104A may be present, however, in a laterally patterned manner, indicated as 104B, which, in the embodiment of FIG. 8B, may provide pronounced etch selectivity upon removal of the silicon oxide-based hard mask features 107B-AB during the subsequent processing.

Figure 9A:
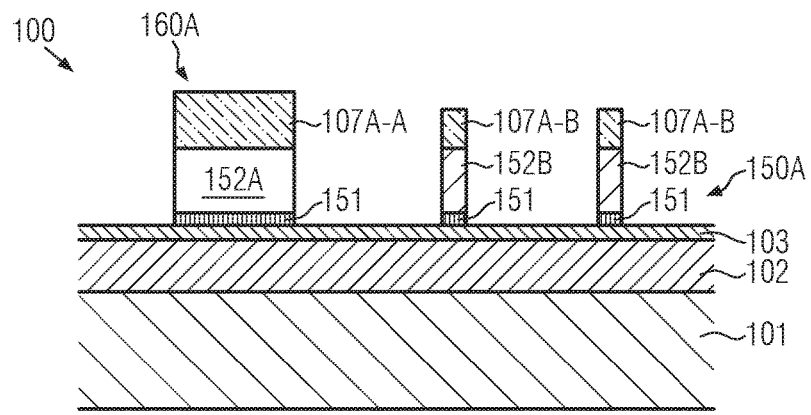
Figure 9B:
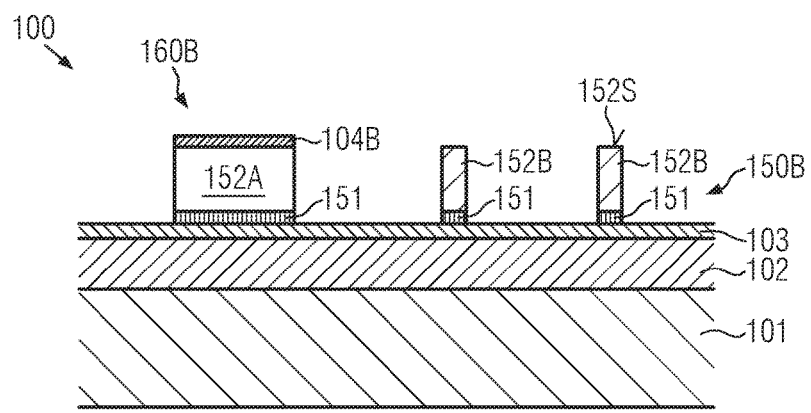

FIGS. 9A and 9B schematically illustrate cross-sectional views of the semiconductor device 100 in a further advanced manufacturing stage. As shown in FIG. 9A, the semiconductor device 100 may comprise gate electrode structures 150A and a non-gate electrode structure 160A, such as a resistor structure and the like, wherein the structures 150A, 160A may have a lateral size and dimension as defined by the hard mask features 107A-AB, as discussed above. That is, the gate electrode structures 150A may substantially correspond in size and shape to the hard mask features 107A-B and may still include these hard mask features, followed by the metal semiconductor compound 152B, wherein, as already discussed above, a respective thickness or depth thereof may depend on process parameters so that, in some illustrative embodiments (not shown), the portion 152B may still include a certain amount of non-converted semiconductor material, while, in other cases, the portion 152B may fully extend to the layer or layer system 151 in the form of a metal semiconductor compound. On the other hand, the non-gate electrode structure 160A may comprise the hard mask feature 107A-A and the patterned non-reacted portion 152A and the layer or layer system 151.

FIG. 9B schematically illustrates the semiconductor device 100 in a stage wherein, during the patterning of respective gate electrode structures 150B and a non-gate electrode structure 160B, the corresponding hard mask features 107B-AB (FIG. 8B) have been removed. This may be accomplished during the process for patterning the layer 151 during a well-established process sequence, or may be accomplished on the basis of an additional etch or cleaning step without unduly contributing to overall process complexity. Due to the high etch selectivity of silicon dioxide material with respect to a silicon nitride material, such as the mask 104B, the non-gate electrode structure 160B may still comprise the mask 104B or at least a significant portion thereof, thereby still reliably covering the non-reacted patterned portion 152A.

It should be appreciated, as discussed above, that in some illustrative embodiments, a length of the gate electrode structures 150A, 150B may be in the range of 30 nm and significantly less, for instance, when fully depleted SOI transistor elements are considered.

Furthermore, in the gate electrode structures 150B, respective surface areas 152S of the metal semiconductor compound portions 152B may be exposed upon removing the previously used hard mask features, which may significantly reduce overall process complexity during the subsequent processing.

Figure 10A:
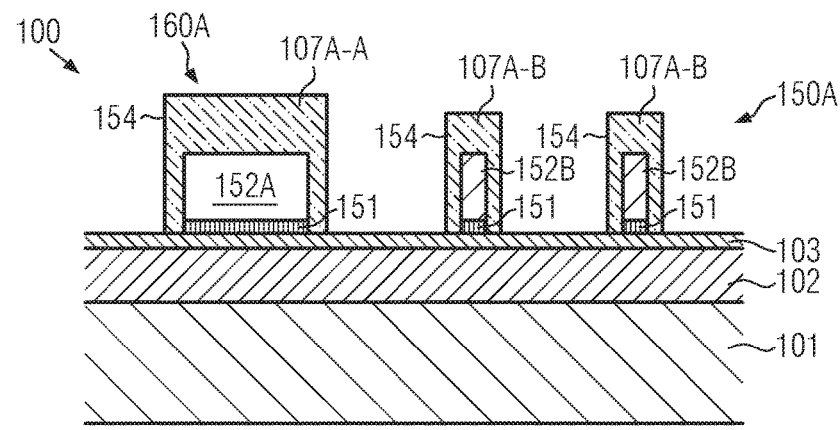
Figure 10B:
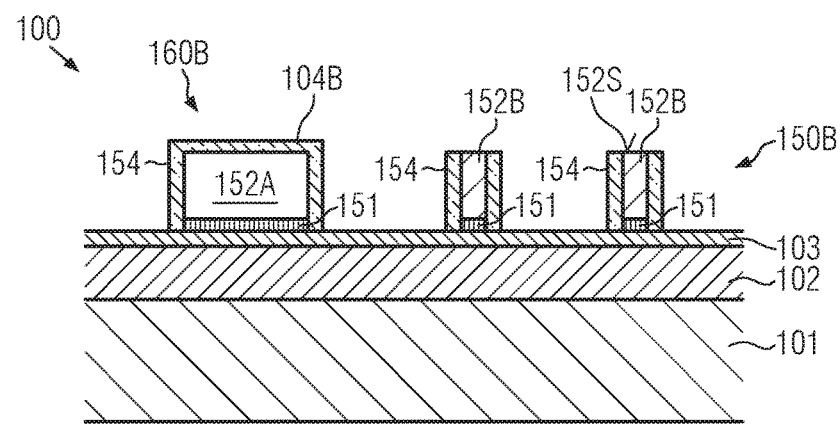

FIGS. 10A and 10B schematically illustrate cross-sectional views of the semiconductor device 100 after performing a respective process sequence for forming sidewall spacer elements. As shown in FIG. 10A, respective sidewall spacers 154, for instance, comprising silicon nitride, SiBCN, SiCOH and the like, possibly in combination with other materials, may be formed on sidewalls of the gate electrode structures 150A, which still include the hard mask features 107A-B. Similarly, the non-gate electrode structure 160A may comprise the sidewall spacers 154 and may also include the hard mask feature 107A-A.

On the other hand, the semiconductor device 100 as shown in FIG. 10B may comprise the sidewall spacers 154 in the gate electrode structures 150B and the non-gate electrode structure 160B, which is still covered by the mask 104B, while the surface areas 152S of the corresponding metal semiconductor compound portions 152B may still be exposed.

It should be appreciated that the sidewall spacers may be formed on the basis of well-established process techniques, i.e., by depositing an appropriate material, such as silicon nitride, SiBCN or SiCOH, possibly in combination with a thin etch stop layer, if required, and a subsequent etch process or etch sequence for removing the previously deposited spacer material from any horizontal device areas, i.e., from the top of the structures 150A, 150B, 160A, 160B and from the respective horizontal portions of the semiconductor layer 103.

Figure 11A:
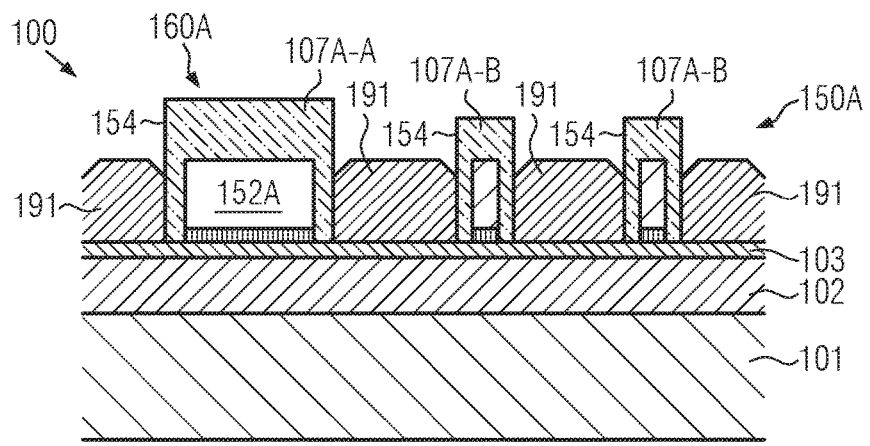
Figure 11B:
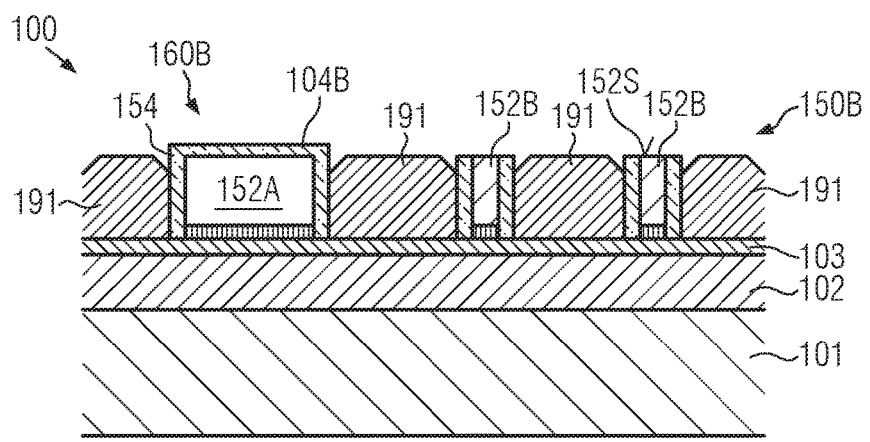

FIGS. 11A, 11B schematically illustrate cross-sectional views of the semiconductor device 100 in a further advanced manufacturing stage, i.e., after performing one or more selective epitaxial growth processes. As shown, raised drain and source regions 191 may be formed adjacent to the respective gate electrode structures 150A, 150B and adjacent to the non-gate structures 160A, 160B. The raised drain and source regions 191, as discussed above, may represent a substantially crystalline semiconductor material having a desired high dopant concentration included therein in order to provide low resistivity in combination with a desired dopant concentration and profile within respective portions of the semiconductor layer 103.

The selective epitaxial growth processes may be performed on the basis of well-established process techniques in which, after respective cleaning processes, appropriate deposition conditions may be established in order to achieve semiconductor growth on the basis of any exposed semiconductor-based surface areas. Consequently, any exposed portions of the semiconductor layer 103 may act as a growth surface, while other semiconductor-based device areas, such as the non-reacted portions 152B of the non-gate electrode structures 160A, 160B, respectively, may be masked by the hard mask feature 107A-A and the sidewall spacer element 154 in the non-gate electrode structure 160A of FIG. 11A, while the portion 152A of the non-gate electrode structure 160B may be reliably covered by the sidewall spacer 154 and the mask 104B for the embodiment shown in FIG. 11B.

It should be noted that the gate electrode structures 150A may also still be covered by the hard mask features 107A-B, as is the case in conventional strategies in which, in this manufacturing stage, the respective gate electrode structures may still be typically comprised of a semiconductor material, which may have to be covered during the respective growth process. On the other hand, as shown in FIG. 11B, the gate electrode structures 150B may have the exposed surface areas 152S, which, however, in this manufacturing stage, are provided in the form of a metal semiconductor compound, thereby substantially avoiding any significant adhesion of semiconductor material during the respective selective growth process. Consequently, during the selective epitaxial growth process, the sidewall spacers 154 and the mask 104B, which may have already been provided in a very early manufacturing stage may still provide for integrity of the portion 152A of the non-gate electrode structure 160B of FIG. 11B, without requiring any further cap material, which may have to be removed in a later manufacturing stage according to conventional process strategies and also during the further processing of the semiconductor device 100 of FIG. 11A.

Figure 12A:
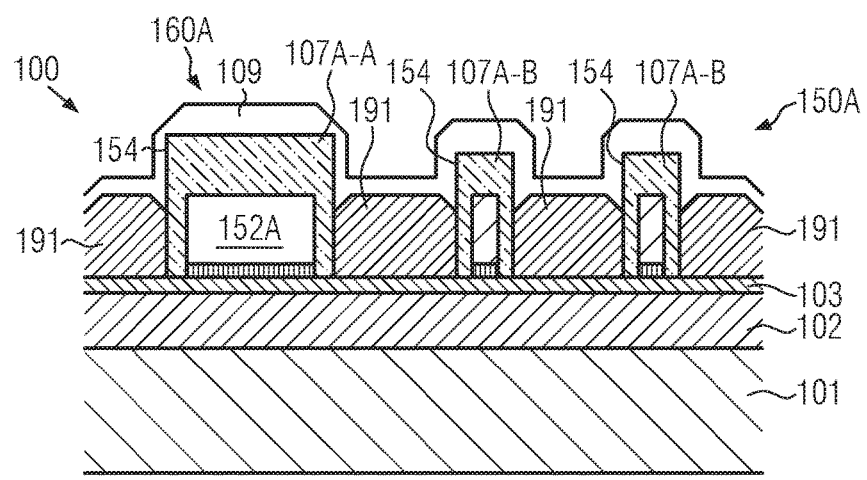
Figure 12B:
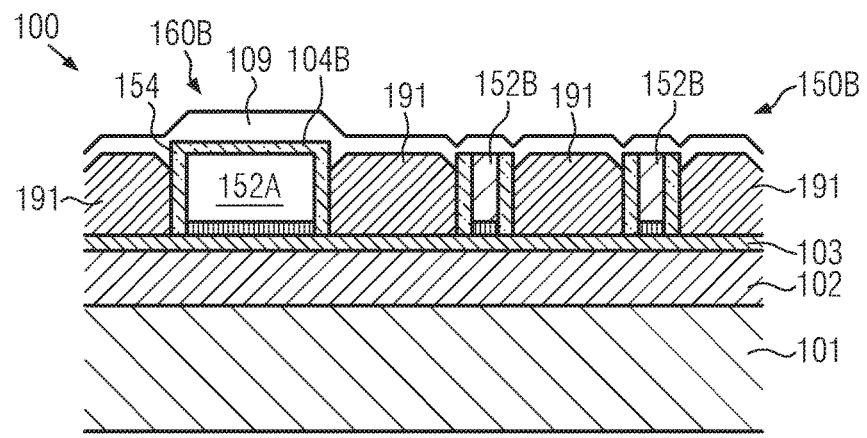

FIGS. 12A and 12B schematically illustrate cross-sectional views of the semiconductor device 100 in a further advanced manufacturing stage. As illustrated, the further processing may be continued by depositing one or more appropriate metal layers 109, which may be selected so as to obtain a desired type of metal semiconductor compound in the raised drain and source regions 191.

It is to be noted that the semiconductor device 100 of FIG. 12A may still have formed thereon the respective hard mask features 107A-AB in the non-gate electrode structure 160A and the gate electrode structures 150A, respectively, while, in the semiconductor device 100 of FIG. 12B, the layer or layers 109 may be formed on the mask 104B and exposed surface areas of the gate electrode structures 150B. That is, in those illustrative embodiments illustrated in FIGS. 12A and 12B, the one or more metal layers 109 may be deposited on the device configuration shown in FIGS. 11A and 11B without requiring any further deposition and/or patterning processes.

Contrary to this, in conventional strategies, a common conversion process for forming metal semiconductor compounds in the raised drain and source regions 191 and in the respective gate electrode structures 150A, 150B may have to be performed, thereby requiring exposure of the semiconductor material in the respective conventional gate electrode structures. To this end, a relatively complex cap removal process may have to be implemented in which, typically on the basis of a wet chemical etch recipe, respective silicon nitride material may have to be removed, such as the hard mask features 107A-B, thereby also removing any protecting hard mask material above the non-gate electrode structures. Consequently, in the conventional procedure, a further mask layer, such as the layer 104 (see FIG. 1) may have to be formed in this late manufacturing stage and may have to be patterned so as to reliably cover any respective non-gate electrode structures, such as the structures 160A, 160B.

On the other hand, according to illustrative embodiments as described in the context of FIGS. 1-12A, a corresponding removal of any cap material of the gate electrode structures may not be necessary in this manufacturing stage. In accordance with embodiments described in the context of FIGS. 1-12B, a corresponding removal may be completely omitted, since the gate electrode structures 150B may already be provided with exposed surface areas 152S, as discussed above, thereby contributing to a significantly reduced overall process complexity.

Figure 13A:
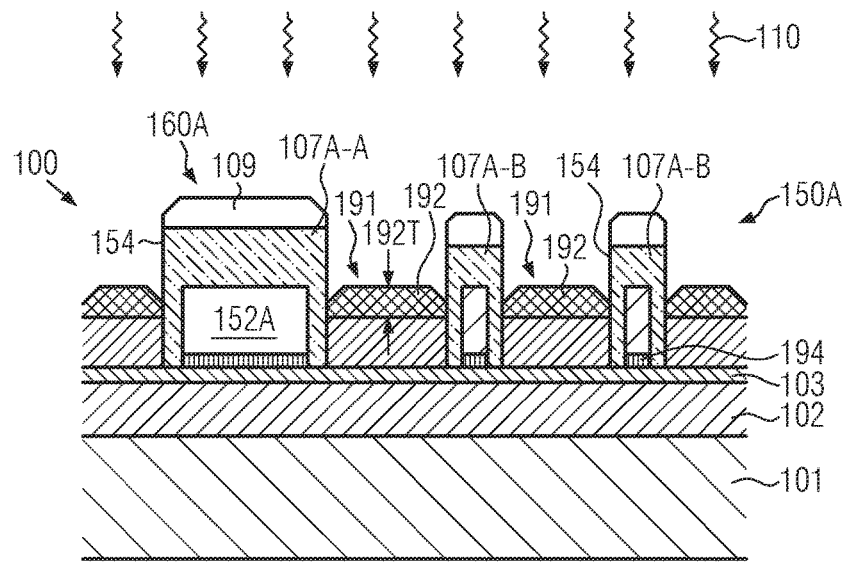
Figure 13B:
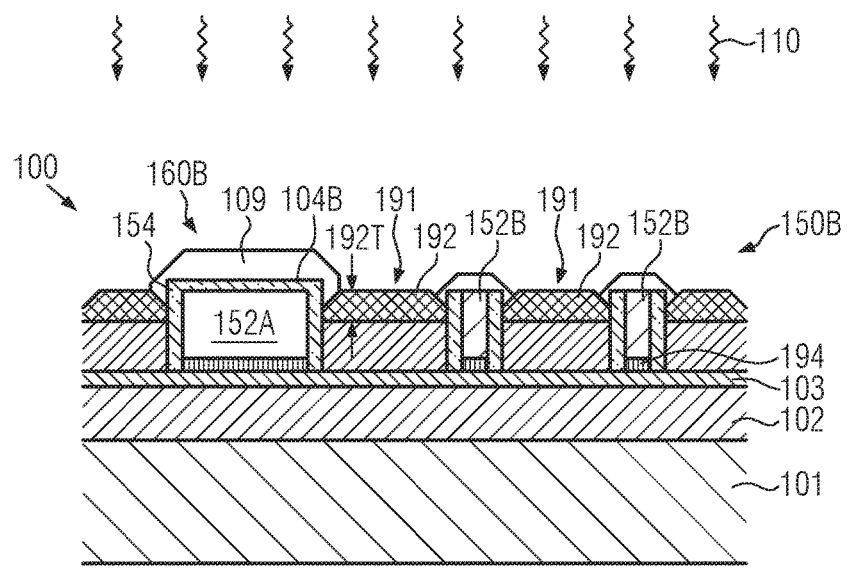

FIGS. 13A and 13B schematically illustrate cross-sectional views of the semiconductor device 100 during a treatment 110 so as to convert a portion of the raised drain and source regions 191 into a metal semiconductor compound 192. To this end, the material or materials of the layer or layer system 109, the thickness thereof and process parameters of the treatment 110 may be selected so as to obtain a desired "penetration depth" of the metal species in the layer 109, thereby substantially defining a thickness or depth 192T of the metal semiconductor compound 192. On the other hand, other semiconductor areas, such as the portions 152B are reliably covered and, therefore, will substantially not take part in the respective conversion process. Similarly, in the semiconductor device 100 of FIG. 13B, only a minute change of characteristics of the metal semiconductor portions 152B may be effected, irrespective of the direct contact with the material of the layer 109, since the corresponding metal semiconductor compound portions 152B may have been stabilized in the previous process sequence, thereby substantially avoiding significant chemical reaction with the metal of the layer 109. For example, in some illustrative embodiments, the metal semiconductor compound portions 152B may have been formed on the basis of a metal and process conditions in which a higher temperature may be required for initiating chemical reaction and/or stabilizing the resulting compound, while during the process 110 for forming the metal semiconductor compound portions 192, reduced process temperatures may suffice for converting the semiconductor material into a compound and stabilizing the same, thereby substantially preserving integrity of the previously formed portions 152B. In other cases, substantially the same metal components, such as nickel, platinum, titanium and the like, may be used for the compound portions 192 and 152B, thereby substantially also avoiding a significant surface reaction in the exposed gate electrode structures 150B of the device 100 of FIG. 13B wherein nevertheless the thickness 192T may be selected so as to comply with the requirements of the drain and source regions 191 without affecting the conductivity of the gate electrode structures 150A, 150B.

Irrespective of the process sequence applied, the metal semiconductor compound portions 192 and 152B may be specifically designed for the respective purposes, for instance, for significantly increasing overall conductivity of the respective gate electrode structures 150A, 150B on the one hand, while providing a desired low contact resistance without increasing the probability of penetration into a channel region 194.

Figure 14A:
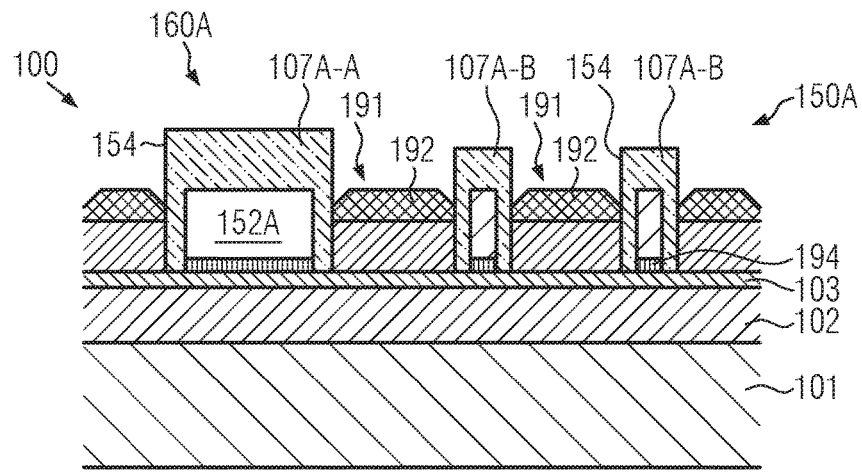
Figure 14B:
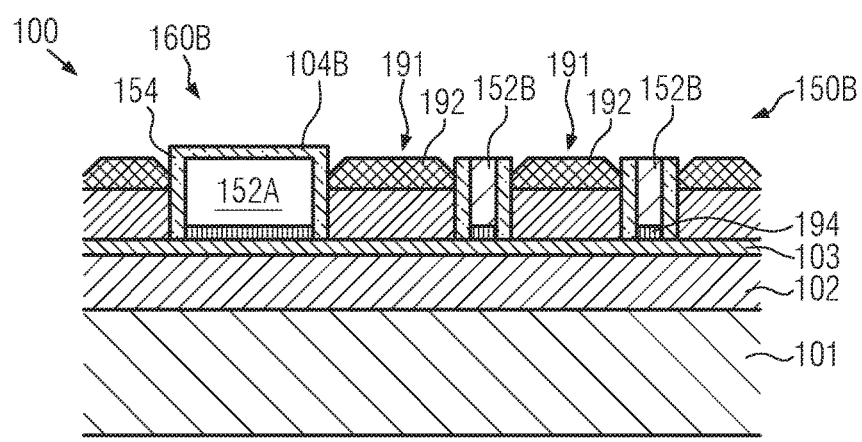

FIGS. 14A and 14B schematically illustrate the semiconductor device 100 after the removal of residual metal material of the layer 109 (see FIGS. 13A and 13B), which may be accomplished on the basis of any well-established etch recipes. Thereafter, the semiconductor device 100 as shown in FIG. 14A may be further processed so as to expose surface areas of the gate electrode structures 150A, which may be accomplished by well-established etch recipes, as may also be applied in conventional strategies, as discussed above. As also previously explained, however, in conventional strategies, the respective cap materials, such as the hard mask feature 107A-B, may have to be removed prior to forming the metal semiconductor compound portions 192.

Figure 15:
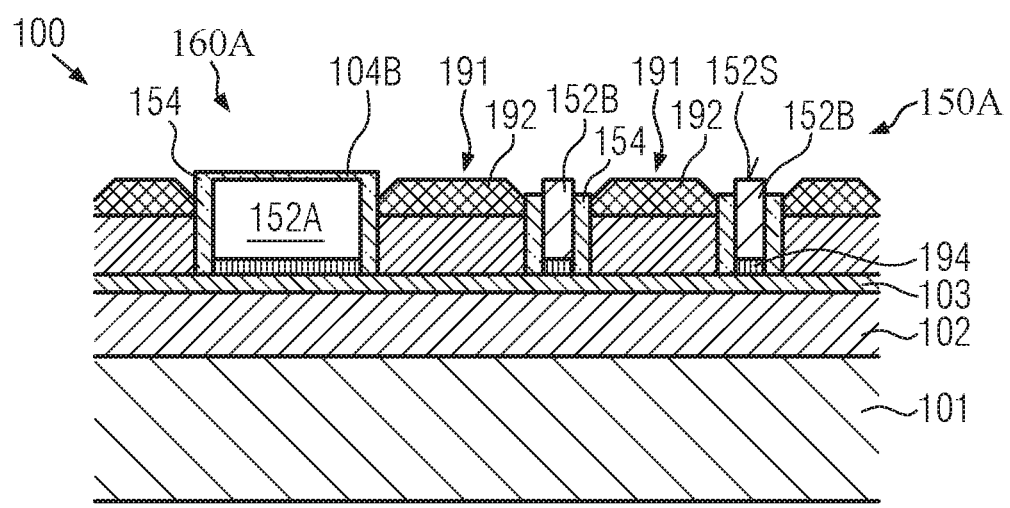
FIG. 15 schematically illustrates the semiconductor device in a manufacturing stage following the stage as shown in FIG. 14A, according to illustrative embodiments.

FIG. 15 schematically illustrates the semiconductor device 100 wherein, when starting from the device configuration as shown in FIG. 14A, the respective hard mask features 107A-AB may be removed, for instance, by wet chemical etch recipes, plasma-assisted etch recipes and the like, thereby exposing surface areas 152S of the gate electrode structures 150A. Furthermore, during the corresponding etch process, the respective sidewall spacers 154 may be recessed to a certain degree. Furthermore, as also indicated above, since the hard mask feature 107A-A (see FIG. 14A) may still include the previously applied material of the layer 104 (see FIGS. 1 and 2), here indicated as 104B, the non-gate electrode structure 160A may still be covered by the layer 104B of reduced thickness.

Figure 16A:
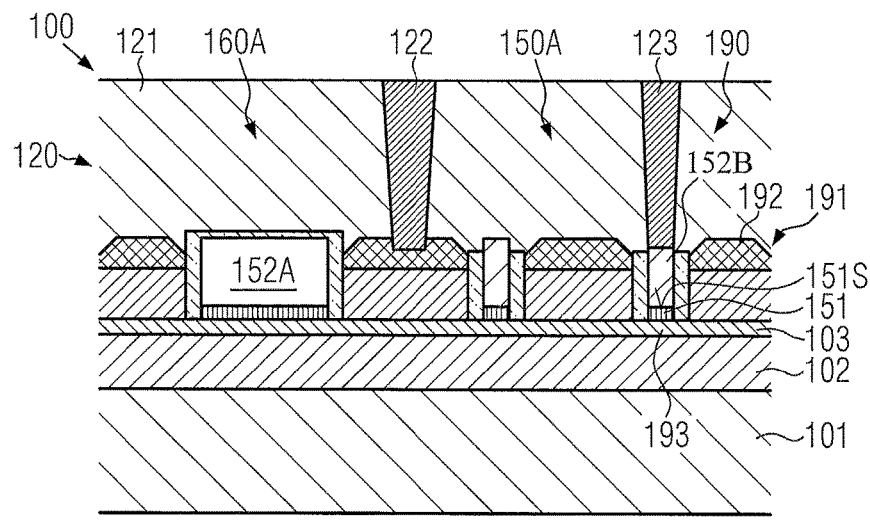
FIGS. 16A and 16B schematically illustrate cross-sectional views of the semiconductor device in a very advanced manufacturing stage according to still further illustrative embodiments.
Figure 16B:
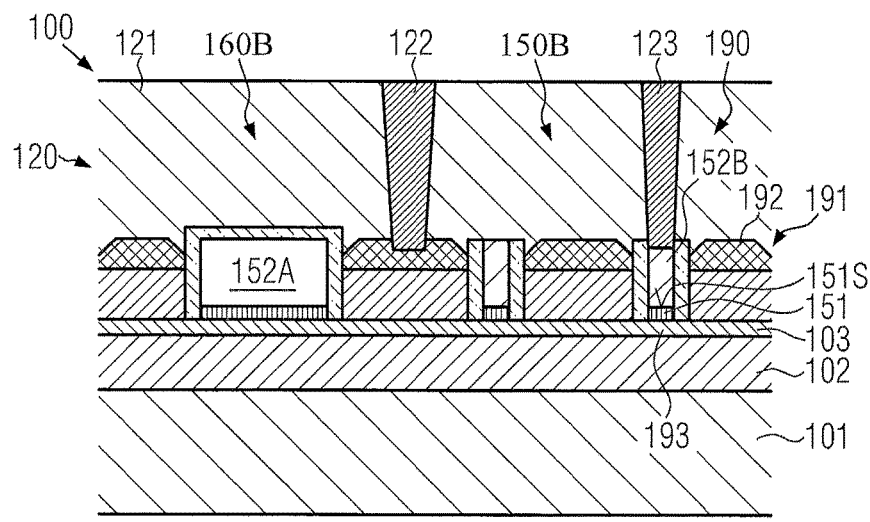

FIGS. 16A and 16B schematically illustrate cross-sectional views of the semiconductor device 100 in a relatively advanced manufacturing stage. As illustrated, the semiconductor devices 100 of FIGS. 16A and 16B may substantially have a very similar overall configuration, wherein transistor elements 190 may be provided so as to comprise the gate electrode structure 150A or the gate electrode structure 150B, either of which may comprise the metal semiconductor compound portion 152B, which may be provided in the form of a metal silicide, as discussed above. As explained earlier, irrespective of whether the gate electrode structure 150A or the gate electrode structure 150B is considered, the respective portion 152B may have a desired material composition which may be substantially the same or which may differ from a material composition of the metal semiconductor compound portions 192 of the raised drain and source regions 191. Moreover, a thickness or depth of the portions 192 may differ from a thickness or depth of the portions 152B, as also already discussed above. Consequently, the transistor elements 190 may be formed on the basis of metal semiconductor compound portions 152B for the gate electrode structure and portions 192 for the raised drain and source regions 191, which may differ in material composition and/or depth or thickness thereof. Furthermore, in one illustrative embodiment, the metal semiconductor compound portion 152B may represent a substantially fully converted portion extending down to the layer 151, which may represent a non-silicon layer, thereby forming a respective interface 151S between the non-silicon material layer of the gate electrode structures 150A, 150B and the adjacent metal semiconductor portion 152B.

In addition to the transistor elements 190, the devices 100 of FIGS. 16A and 16B may comprise the non-gate electrode structures 160A, 160B, respectively, including the non-converted semiconductor-based portion 152A, which may represent, for instance, a resistor and the like. It should be appreciated that, at any appropriate area, the corresponding non-converted portions 152A may connect to a corresponding metal silicide area for connecting the non-gate electrode structures 160A, 160B to other circuit elements or a metallization system (not shown) in accordance with device requirements.

Moreover, in the manufacturing stage shown, the semiconductor devices 100 may comprise a contact level 120, which may include one or more dielectric materials 121, such as silicon nitride, silicon dioxide and the like, in which respective contact elements 122, 123 may be formed so as to connect to respective device areas, such as the raised drain and source regions 191 and the gate electrode structures 150A, 150B. The contact level 120 may be formed on the basis of well-established strategies, for instance, by depositing silicon nitride, silicon dioxide and the like, and planarizing the resulting surface typography, followed by sophisticated lithography and etch techniques for forming openings to the respective device areas, such as the raised drain and source regions and the gate electrode structures, wherein respective openings may be formed in a common patterning process or in separate lithography and etch steps. Thereafter, the openings may be filled with appropriate materials, such as tungsten in combination with tungsten silicide and the like, followed by a removal of any non-required metal materials.

As a result, the present disclosure provides manufacturing techniques and resulting semiconductor devices in which the increase of conductivity of a gate electrode material, initially provided as a semiconductor material, may be accomplished prior to actually patterning the gate electrode structures by performing an early conversion process, such as a silicidation process, thereby providing the possibility of appropriately adjusting material composition and/or final depth or thickness of the metal semiconductor compound. During this process sequence, any device regions that do not require the formation of a metal semiconductor compound may also be efficiently masked, wherein the mask material may be maintained throughout the entire process sequence for completing transistor elements.

During the further manufacturing process, the metal semiconductor compound in the raised drain and source regions may be formed on the basis of requirements specifically selected in accordance with the drain and source regions, substantially without affecting the previously established metal semiconductor compound in the gate electrode structure. In some illustrative embodiments, the semiconductor material of the gate electrode material may be substantially completely converted into a metal semiconductor compound, while, on the other hand, an appropriate thickness of the metal semiconductor compound in the raised drain and source regions may be selected so as to specifically meet the requirements of these regions. Therefore, the metal semiconductor compound in the raised drain and source regions may be formed with high reliability without the risk of penetration of the channel regions, while, on the other hand, superior conductivity of the gate electrode structure may be accomplished. Therefore, superior transistor performance, for instance in view of RF characteristics, may be accomplished. Furthermore, if desired, the total height of the gate electrode structure may be reduced due to the possibility of allowing the increase of the depth or thickness of the metal semiconductor compound formed therein in an early manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a semiconductor-containing material layer above a semiconductor layer, said semiconductor-containing material layer having an upper surface;
   forming a patterned mask layer above said upper surface of said semiconductor-containing material layer, said patterned mask layer exposing a first part of said semiconductor-containing material layer while covering a second part of said semiconductor-containing material layer;
   with said patterned mask layer in position, converting at least a portion of said first part of said semiconductor-containing material layer into a first metal semiconductor compound;
   removing said patterned mask layer;
   forming a gate electrode structure that comprises said first metal semiconductor compound;
   forming drain and source regions adjacent to said gate electrode structure; and
   forming a second metal semiconductor compound in said drain and source regions.

2. The method of claim 1, wherein said second part of said semiconductor-containing material layer is substantially free of said first metal semiconductor compound.

3. The method of claim 2, further comprising forming a non-gate electrode structure that comprises at least a portion of said second part of said semiconductor-containing material layer.

4. The method of claim 1, wherein said patterned mask layer comprises silicon nitride.

5. The method of claim 1, wherein said patterned mask layer comprises silicon dioxide.

6. The method of claim 1, wherein forming said gate electrode structure comprises forming a second patterned mask layer, and patterning at least said first part of said semiconductor-containing material layer on the basis of said second patterned mask layer.

7. The method of claim 1, wherein prior to forming the second metal semiconductor compound in said drain and source regions, the method further comprises selectively growing a semiconductor material on exposed portions of said semiconductor layer in said drain and source regions and forming said second metal semiconductor compound on said selectively grown semiconductor material.

8. The method of claim 1, wherein said first and second metal semiconductor compounds are formed so as to have different vertical thicknesses and different material compositions.

9. The method of claim 1, wherein said first and second metal semiconductor compounds are formed so as to have different vertical thicknesses.

10. The method of claim 1, wherein said first and second metal semiconductor compounds are formed so as to have different material compositions.

11. The method of claim 1, wherein said first metal semiconductor compound is formed so as to form an interface with a material layer formed below said semiconductor-containing material layer.

12. A method, comprising:
forming a mask layer above a layer stack for a semiconductor device, said mask layer exposing a first portion of said layer stack and covering a second portion of said layer stack, said layer stack comprising a silicon-containing layer for a gate electrode structure;
converting said first portion into a metal semiconductor compound and preserving said second portion by using said mask layer;
forming a hard mask layer above said layer stack and patterning said hard mask layer so as to define lateral sizes and shapes of said gate electrode structure above said first portion and of a non-gate electrode structure above said second portion; and
forming said gate electrode structure and said non-gate electrode structure by patterning said layer stack using said patterned hard mask layer.

13. The method of claim 12, further comprising forming raised drain and source regions adjacent to said gate electrode structure and said non-gate electrode structure and forming a further metal semiconductor compound in said raised drain and source regions in the presence of said mask layer that covers said second portion.

14. The method of claim 13, wherein said hard mask comprises silicon dioxide.

15. The method of claim 14, further comprising removing said hard mask so as to expose said gate electrode structure prior to forming said raised drain and source regions.

16. The method of claim 13, wherein said hard mask comprises silicon nitride.

17. The method of claim 13, wherein said metal semiconductor compound and said further metal semiconductor compound are formed so as to differ in at least one of thickness and material composition.

18. A method, comprising:
forming a semiconductor-containing material layer above a semiconductor layer;
forming a patterned mask layer above said semiconductor-containing material layer, said patterned mask layer covering a first laterally defined portion of said semiconductor-containing material layer while exposing a second laterally defined portion of said semiconductor-containing material layer;
forming a metal layer on and in contact with said patterned mask layer and on and in contact with an upper surface of said second laterally defined portion of said semiconductor-containing material layer;
converting at least a portion of a vertical thickness of said second laterally defined portion of said semiconductor-containing material layer into a metal semiconductor compound while not forming said metal semiconductor compound in at least a portion of said first laterally defined portion of said semiconductor-containing material layer;
forming a gate electrode structure on the basis of said metal semiconductor compound in said second laterally defined portion of said semiconductor-containing material layer;
forming drain and source regions adjacent to said gate electrode structure; and
forming a second metal semiconductor compound in said drain and source regions.

19. The method of claim 18, wherein said patterned mask layer comprises silicon dioxide.

20. The method of claim 18, wherein said patterned mask layer comprises silicon nitride.

* * * * *